US006026896A

United States Patent [19]

Hunter

[11] Patent Number: 6,026,896

[45] Date of Patent: Feb. 22, 2000

[54] TEMPERATURE CONTROL SYSTEM FOR SEMICONDUCTOR PROCESSING FACILITIES

[75] Inventor: Reginald Hunter, Round Rock, Tex.

[73] Assignee: Applied Materials, Inc., Santa Clara, Calif.

[21] Appl. No.: 08/835,985

[22] Filed: Apr. 10, 1997

[51] Int. Cl.[7] ........ F24F 3/00

[52] U.S. Cl. ........ 165/206; 165/80.4; 165/80.2

[58] Field of Search ........ 165/206, 263, 165/261, 262, 80.4, 80.5, 104.31, 104.33

[56] References Cited

U.S. PATENT DOCUMENTS

| | | | |
|---|---|---|---|
| 2,357,706 | 9/1944 | Toepperwein | 165/206 |
| 3,236,292 | 2/1966 | Smith, Jr. | 165/11.1 |
| 3,735,805 | 5/1973 | Stillhard | 165/206 |
| 3,847,209 | 11/1974 | Mascall | 165/206 |
| 4,065,369 | 12/1977 | Ogawa et al. . | |
| 4,423,303 | 12/1983 | Hirose et al. . | |
| 4,621,678 | 11/1986 | Hahn et al. | 165/263 |
| 4,651,813 | 3/1987 | Witt et al. | 165/263 |
| 4,729,424 | 3/1988 | Mizuno et al. | 165/261 |
| 4,747,928 | 5/1988 | Takahashi et al. . | |
| 4,804,431 | 2/1989 | Ribner . | |
| 4,902,099 | 2/1990 | Okamoto et al. . | |
| 5,029,445 | 7/1991 | Higgins . | |
| 5,154,661 | 10/1992 | Higgins . | |
| 5,320,982 | 6/1994 | Tsubone et al. . | |
| 5,348,076 | 9/1994 | Asakawa | 165/282 |
| 5,349,154 | 9/1994 | Harker et al. . | |
| 5,359,177 | 10/1994 | Taki et al. . | |
| 5,413,164 | 5/1995 | Teshima et al. | 165/206 |
| 5,450,726 | 9/1995 | Higgins . | |
| 5,494,494 | 2/1996 | Mizuno et al. . | |
| 5,535,818 | 7/1996 | Fujisaki et al. | 165/104.33 |
| 5,558,717 | 9/1996 | Zhao et al. . | |
| 5,567,267 | 10/1996 | Kazama et al. . | |
| 5,579,826 | 12/1996 | Hamilton et al. | 165/80.4 |
| 5,592,358 | 1/1997 | Shamouilian et al. . | |
| 5,607,009 | 3/1997 | Turner et al. . | |
| 5,613,364 | 3/1997 | Higgins . | |
| 5,706,890 | 1/1998 | Sloan et al. | 165/206 |

FOREIGN PATENT DOCUMENTS

| | | | |
|---|---|---|---|
| 611052 | 8/1994 | European Pat. Off. | 165/80.5 |
| 2-197142 | 8/1990 | Japan | 165/80.5 |
| 8202764 | 8/1982 | WIPO | 165/104.31 |

*Primary Examiner*—Ira S. Lazarus
*Assistant Examiner*—Terrell McKinnon
*Attorney, Agent, or Firm*—Thomason Moser & Patterson

[57] ABSTRACT

The present invention generally provides a system for controlling the temperature of multiple components of a semiconductor processing device or fabrication facility. The system includes a common source of a heated or chilled fluid that is distributed to multiple process components for use in heating or cooling. The multiple process components may be part of the same chamber or process, serve different processes in the same or different cluster tool, serve a combination of stand-alone and cluster tools, or any combination of process components located in a common fabrication facility. Each process component includes a flow control valve that controls the temperature of each component.

26 Claims, 2 Drawing Sheets

TEMPERATURE CONTROL SYSTEM FOR SEMICONDUCTOR PROCESSING FACILITIES

FIELD OF THE INVENTION

The present invention relates to temperature control systems for semiconductor processing equipment. More particularly, the invention relates to heat transfer fluid systems for use in temperature control of various semiconductor processing chambers.

BACKGROUND OF THE RELATED ART

The manufacture of semiconductors can involve a variety of unit processes including physical vapor deposition, metal and dielectric chemical vapor deposition, plasma etching, chemical-mechanical polishing and the like. Any or all of these units may be located in a single fabrication facility. These fabrication facilities include clean room facilities in which the various unit processes are located in order to reduce particulate contamination that can cause defects in the wafer. Because it is expensive to build and operate clean rooms, only those portions of the process that are associated directly with the wafer are housed in the clean room. Presently, fabrication facilities have different levels of clean room environments so that the most sensitive processes or procedures can be carried out in the most clean environments and the most insensitive processes or procedures can be carried out in less clean environments. In this manner, the use of the most expensive space is minimized.

Furthermore, it is generally desirable to minimize the use of materials and equipment in the clean room that can generate particles and release them into the air. Therefore, materials that out gas contaminants or generate particles are kept outside of the clean room area that houses sensitive processes. Likewise, equipment that emits byproduct gases, generates particles, alters the humidity or suffers occasional spills are kept in remote locations outside of clean room areas.

While each process has distinctive characteristics and may require specific accommodations for installation and operation, there are some aspects of their operation that are similar. For example, many semiconductor processes are carried out under specific conditions, such as temperature and pressure. These temperatures and pressures may vary between processes and may even vary within the same process over time or according to the particular process recipes being performed.

Temperature control of processing conditions may be used beneficially for many purposes. For example, temperature control of the substrate receiving surface of a support member can enhance uniformity and deposition rate on the substrate. Temperature control of the processing apparatus side walls can also enhance such processing by reducing undesirable condensation of chemical vapors on the chamber walls. Cooling of wafers following certain warm deposition processes speeds the solidification of the deposited materials prior to additional processing and reduces out gassing of undesirable and often corrosive gases when the wafer is removed from the cluster tool.

In those applications, such as temperature control of chamber walls, where a heat transfer fluid may be used to heat or cool a processing unit or chamber component, the fluid is circulated through a heat exchanger which is controlled to deliver the fluid at the temperature desired of the chamber component. For example, if a given substrate is to be processed in a manner that calls for a chamber wall temperature of 150° C., the heat exchanger provides sufficient heat to the circulating fluid so that the fluid temperature leaving the heat exchanger is about 150° C. The setpoint temperature of the exchanger output may be increased to account for an average temperature drop through the tubing and chamber wall. However, this type of adjustment does not allow the temperature of the chamber wall to be maintained under changing thermal loads associated with substrate processing. Separate, dedicated heat exchangers have been required to provide for independent fluid temperatures at different processing units.

A strong need exists for a system that can control the temperature of semiconductor processing chambers despite changes in the thermal loads associated with substrate processing. There is also a need for a temperature control system that involves fewer parts and can rapidly and effectively change the surface temperature of a process element. The system should possess the ability to reduce thermal losses and thermal lag. It would also be desirable if the system provided independent control for each process component.

SUMMARY OF THE INVENTION

The present invention provides a semiconductor fabrication system that comprises a heat exchanger, a manifold in fluid communication with the heat exchanger, a plurality of fluid passages in parallel fluid communication with the manifold wherein each fluid passage has a flow control valve, and a plurality of process components in thermal communication with one of the fluid passages. The manifold may comprise a pump, supply line, return line and a pressure control member in fluid communication between the supply line and the return line. Each flow control valve may include a temperature controller to control the temperature of the process component. It is preferred that the system include a central process controller in electronic communication with the temperature controllers to provide a setpoint to each temperature controller.

The invention also provides a semiconductor fabrication system that comprises a first source of a heat transfer fluid, a plurality of fluid passages in parallel fluid communication with the first source wherein each fluid passage has a flow control valve, and a plurality of process components in thermal communication with one of the fluid passages. The heat transfer fluid may be supplied at either a temperature that is less than the lowest temperature required by the process components or a temperature that is greater than the highest temperature required by any of the process components and has the capacity to support multiple process chamber elements. Optionally, the system may further comprise a second source of a heat transfer fluid, a plurality of fluid passages in parallel fluid communication with the second source wherein each fluid passage has a flow control valve, and a plurality of process components in thermal communication with one of the fluid passages. The first and second sources may be in fluid communication with the same or different plurality of fluid passages. In some applications it will be desirable to have the second source of a heat transfer fluid supplied at lower temperature than the first source.

The invention also provides a method of controlling the temperature of multiple processing components. The method comprises providing a heat transfer fluid to a manifold and controlling the flow of the heat transfer fluid to the individual processing components. It may be desirable to maintain a continuous flow of the heat transfer fluid through the manifold. The continuous flow may be accomplished by controlling the pressure in the manifold.

BRIEF DESCRIPTION OF THE DRAWINGS

So that the manner in which the above recited features and advantages of the present invention are attained can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Figure 1:
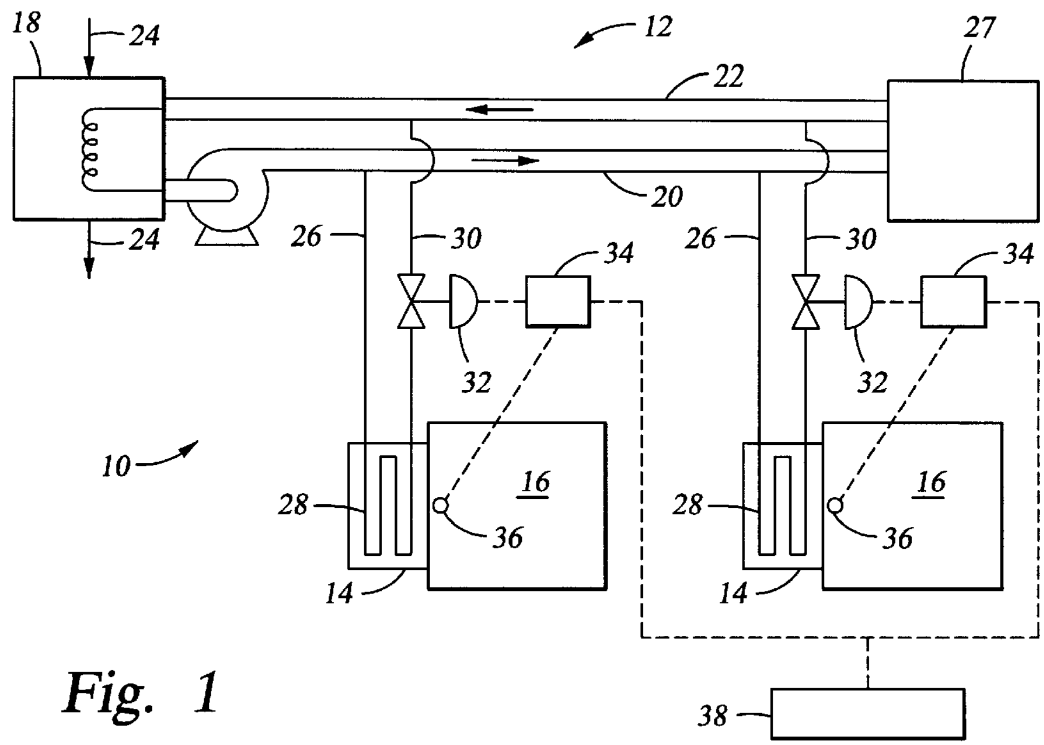
FIG. 1 is a schematic diagram of a temperature control system using a manifold for distribution of a heat transfer fluid to the components of multiple processes.

The present invention generally provides a system for controlling the temperature of multiple components or devices of semiconductor processing equipment. The system includes a source of a heated or chilled fluid that is distributed to multiple process components for use in heating or cooling of those components. The multiple process components may be part of the same chamber or process unit, serve different process units in the same or different cluster tool, serve a combination of stand-alone process units and cluster tools, or any combination of process components located in a common fabrication facility. Each process component includes a flow control valve that controls the temperature of each component.

In one aspect of the invention, a source of a heat transfer fluid is heated or chilled by a heat exchanger and distributed to individual process components through a header or manifold. It is preferred that the heat transfer fluid be continuously circulated through a supply line and a return line of the manifold in order to maintain the fluid at a substantially constant temperature throughout the supply line. It is also preferred that the manifold include a pressure control member, such as a flow control valve to maintain a higher pressure in the supply line than that of the return line to facilitate flow through each process component. Each process component draws fluid from the supply line and includes a control valve to adjust the flow of fluid back to the return line. The control valve may be operated to maintain a setpoint temperature in the process component itself or some other component, typically in contact with the process component. A thermocouple or other temperature sensing device provides an electronic signal that is compared with a setpoint temperature to determine the flow through the valve.

In another aspect of the invention, each individual process component may have a separate, local temperature controller that operates the control valve. Typically, the local temperature controllers will also be in electronic communication with a process controller or computer that will provide a setpoint to each of the local temperature controllers as necessary to accomplish various process recipes.

In yet another aspect of the invention, multiple sources of heat transfer fluid may be provided at different temperatures to serve different process components. For example, a first source of hot fluid may be used to heat certain components, while a second source of chilled fluid may be used to cool other components. Alternatively, first and second sources of hot or chilled fluid may be provided at different temperatures to heat or cool different components having substantially different setpoint temperatures.

Although the present invention would be beneficial to virtually every semiconductor process, the need for more consistent and accurate temperature control becomes ever more important as wafer size increases and circuit density increases. Improved temperature control plays an important role in improving process uniformity and consistency as well as reducing device defects.

FIG. 1 is a schematic diagram of a temperature control system 10 using a manifold 12 for distribution of a heat transfer fluid to process components 14 of multiple processes 16. The manifold 12 is generally comprised of a heat transfer fluid source 18, a fluid supply line 20 and a fluid return line 22. The diagram shows a preferred implementation in which the fluid source 18 is a heat exchanger or chiller of any desirable type, such as a shell-and-tube, double-pipe and the like, that exchanges heat with another fluid supply 24. The preferred implementation also includes a pressure control device 27 which allows a continuous flow of fluid through the manifold 12 from the supply line 20 to the return line 22 while maintaining a pressure differential between the two lines 20 and 22. Having a higher pressure in the supply line 20 than in the return line 22 provides the motive forces necessary to push the fluid through the process component 14.

The process components 14 are in parallel, fluid communication with the manifold 12. Each process component 14 includes an inlet line 26, a fluid passage 28 through the component 14, an outlet line 30 and a control valve 32. The process component 14 can be any part of a semiconductor processing device or utility that benefits from heating or cooling, including, but not limited to, the support member or pedestal, process chamber walls, remote plasma sources and cooldown chambers. It should also be recognized that the process 16 can be any type of semiconductor process that benefits from heating or cooling, including, but not limited to, physical vapor deposition, metal and dielectric chemical vapor deposition, chemical-mechanical polishing, plasma etching and the like.

The flow control valves 32 are preferably operated by local temperature controllers 34. The controllers 34 monitor the electronic signals coming from temperature sensors 36 that are disposed in thermal communication with the associated process components 14. The temperature indicated by each temperature sensor 36 is compared with a setpoint temperature that is provided as an electronic signal to the temperature controller 34 by a process controller or computer 38. When the actual temperature measured by the sensor 36 is different than the setpoint temperature, then an electronic signal is sent to increase or decrease the opening through the control valve 32. For example, assume that the heat exchanger 18 provides a heated fluid to the supply line 20 at a rough temperature greater than the setpoint temperatures for either process component 14 at point 36. If the component temperature is below the setpoint, the valve 32 is further opened to increase the flow of heated fluid therethrough. When the component temperature is above the setpoint, the valve 32 is closed slightly to decrease the flow of heated fluid therethrough. The temperature controller can be tuned in accordance with proportional-integral-derivative (PID) or other types of control logic to provide steady control of the temperature and allow for changes in the setpoint temperature.

By providing a continuous recycle of fluid through the manifold, the heated or chilled fluid is immediately available to any process component at the rough temperature. The transportation lag experienced using dedicated heat exchangers is eliminated and each process component can be inexpensively controlled using a simple local temperature controller.

Figure 2:
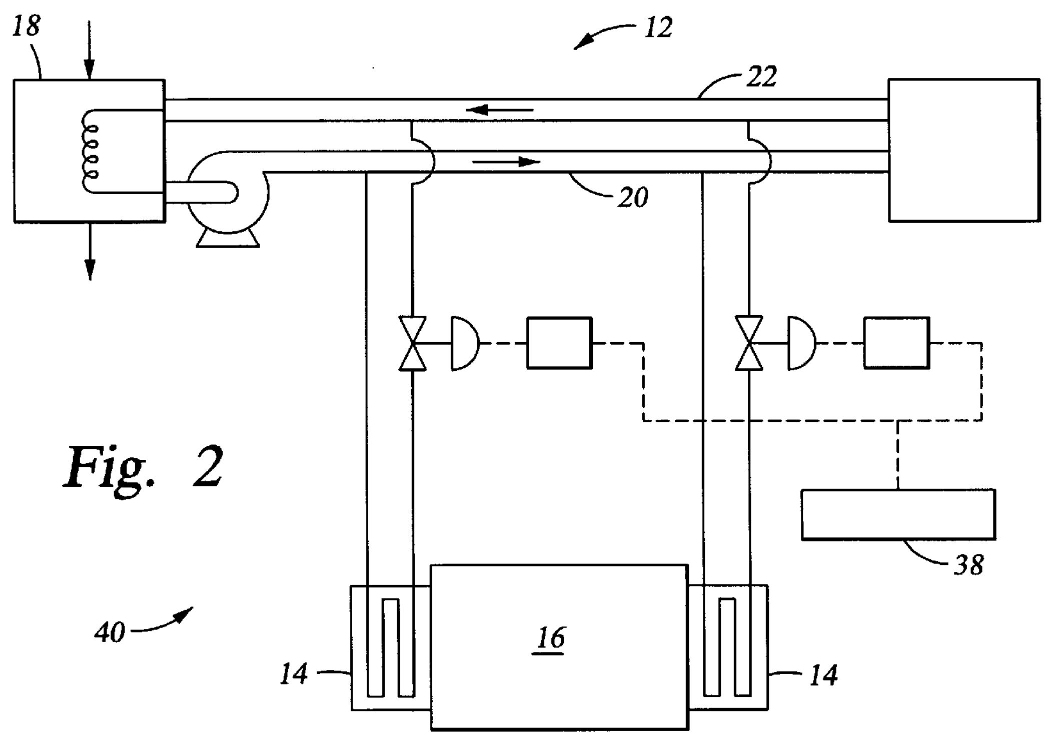
FIG. 2 is a schematic diagram of a temperature control system using a manifold for distribution of a heat transfer fluid to multiple process components of a single process.

FIG. 2 is a schematic diagram of a temperature control system 40 using a manifold 12 for distribution of a heat transfer fluid to multiple process components 14 of a single process unit 16. The system 40 functions in the same manner as that described in relation to FIG. 1, but provides individual component temperature control even within a single process unit. Therefore, it is possible to simultaneously heat and cool separate components or heat (chill) separate components to different setpoint temperatures.

Figure 3:
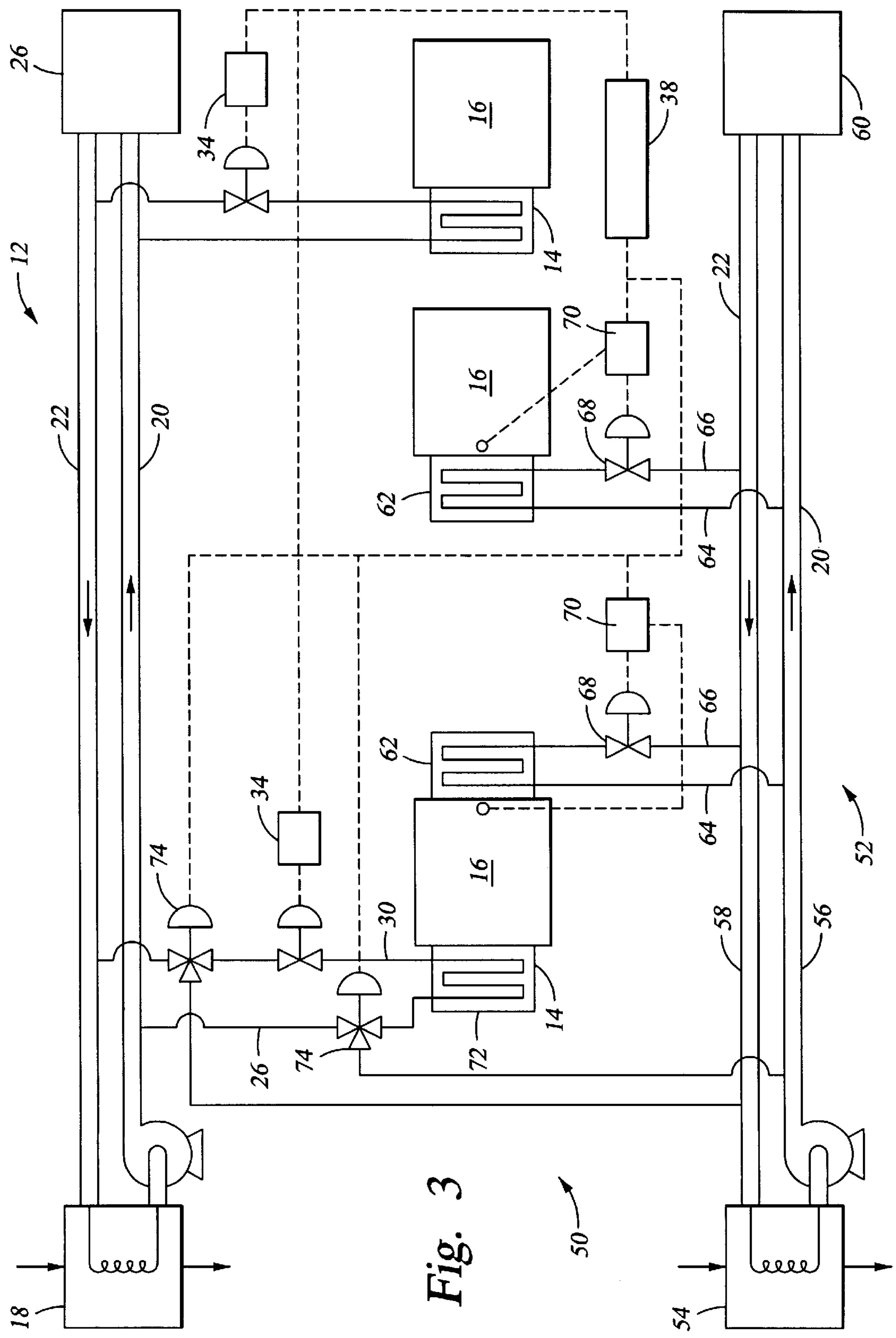
FIG. 3 is a schematic diagram of a temperature control system using two manifolds for distribution of heat transfer fluids at different temperatures to multiple components of multiple processes.

FIG. 3 is a schematic diagram of a temperature control system 50 using two manifolds 12 and 52 for distribution of heat transfer fluids at different temperatures to multiple components of multiple process units. In particular, a second manifold 52 operates in a similar fashion as the manifold 12, except that the fluid is supplied at a different temperature, and includes a fluid source or heat exchanger 54, a supply line 56, a return line 58 and a pressure control device 60. The second manifold 52 is shown in fluid communication with the process components 62 via fluid inlet lines 64 and fluid outlet lines 66. The control valves 68 are preferably positioned in the outlet lines 66 and controlled by local temperature controllers 70. Note that both temperature controllers 34 and 70 may receive their setpoints from the same process controller 38.

It is also possible, as shown with component 72, to provide the option of using the fluid of either manifold 12 or 52. This may be accomplished in numerous ways, but is shown here as including a three-way valve 74 attached to the inlet and outlet lines 26 and 30. The valves 74 are also controlled by the process controller 38.

While the foregoing is directed to the preferred embodiment of the present invention, other and further embodiments of the invention may be devised without departing from the basic scope thereof. The scope of the invention is determined by the claims which follow.

What is claimed is:

1. A semiconductor fabrication system, comprising:

a heat exchanger;

a manifold in fluid communication with the heat exchanger;

a plurality of fluid passages disposed in parallel, fluid communication with the manifold, at least one fluid passage having a flow control valve; and one or more process chambers having one or more process components, at least one process component disposed in thermal communication with one of the fluid passages at a position upstream from the flow control valve.

2. The system of claim 1, wherein the manifold comprises a supply line and a return line and wherein the fluid passages are disposed in parallel fluid communication between the supply line and the return line.

3. The system of claim 2, further comprising:

a pressure control member disposed in fluid communication between the supply line and the return line.

4. The system of claim 1, further comprising a pump disposed in fluid communication between the heat exchanger and the supply line of the manifold.

5. The system of claim 1, wherein at least one process component includes a temperature sensor.

6. The system of claim 5, wherein at least one flow control valve is operated to control the temperature of the process component.

7. The system of claim 6, wherein at least one flow control valve includes a temperature controller.

8. The system of claim 7, further comprising a central process controller in electronic communication with the temperature controllers to provide a setpoint temperature to at least one temperature controller.

9. The system of claim 1, further comprising:

a second heat exchanger;

a second manifold in fluid communication with the second heat exchanger; and a plurality of second fluid passages disposed in parallel, fluid communication with the second manifold, at least one second fluid passage having a flow control valve;

wherein at least one process component is disposed in thermal communication with one of the second fluid passages at a position upstream from the flow control valve.

10. The system of claim 9, wherein the second manifold comprises a second supply line and a second return line and wherein the second fluid passages are disposed in parallel fluid communication between the second supply line and the second return line.

11. The system of claim 10, further comprising:

a second pressure control member disposed in fluid communication between the second supply line and the second return line.

12. The system of claim 1, wherein the heat exchanger cools a fluid to a temperature that is less than the lowest temperature required by the process components.

13. The system of claim 1, wherein the heat exchanger heats a fluid to a temperature that is greater than the highest temperature required by the process components.

14. A semiconductor fabrication system, comprising:

a first source of heat transfer fluid having a first manifold;

a second source of heat transfer fluid having a second manifold;

a plurality of fluid passages disposed in parallel, fluid communication with the first manifold and the second manifold, at least one fluid passage having a flow control valve adapted to proportionately control flow of heat transfer fluid from the first source and the second source into the fluid passage; and one or more process chambers having one or more process components, at least one process component disposed in thermal communication with the at least one fluid passage.

15. The system of claim 14, wherein the first source of heat transfer fluid is at a temperature that is less than the lowest temperature required by the process components and the second source of heat transfer fluid is at a temperature that is greater than the highest temperature required by the process components.

16. The system of claim 15, further comprising:

a controller connected to at least one flow control valve adapted to proportionally control amounts of the first heat transfer fluid and the second heat transfer fluid flowing into the fluid passage.

17. The system of claim 16, further comprising:

a temperature sensor connected to each process component to supply temperature measurements to the controller.

18. The system of claim 14, wherein the first and second manifolds comprise:

a first supply line and a first return line connected to the first source of heat transfer fluid; and a second supply line and a second return line connected to the second source of heat transfer fluid;

wherein the plurality of fluid passages are connected in parallel fluid communication between the first supply line and the first return line and between the second supply line and the second return line.

19. The system of claim 18, further comprising:

a first pressure control member connected between the first supply line and the first return line; and a second pressure control member connected between the second supply line and the second return line.

20. The system of claim 14, further comprising a flow control valve disposed at an outlet of at least one component fluid passage.

21. A method of controlling temperatures of a plurality of processing components, comprising:

providing a heat transfer fluid to a plurality of fluid passages connected in parallel to a manifold;

disposing one or more processing components in thermal communication with one or more fluid passages; and controlling flow of the heat transfer fluid in a fluid passage using a flow control valve disposed on the fluid passage at a position downstream from a processing component.

22. The method of claim 21, further comprising maintaining a continuous flow of the heat transfer fluid through a supply line and a return line of the manifold, wherein the plurality of fluid passages are connected in parallel between the supply line and the return line.

23. The method of claim 22, further comprising controlling a pressure differential between a supply line and a return line of the manifold.

24. A method of controlling temperatures of a plurality of processing components, comprising:

providing a first heat transfer fluid and a second heat transfer fluid to a plurality of fluid passages connected in parallel fluid communication with a first manifold and a second manifold;

disposing one or more processing components in thermal communication with one or more fluid passages; and controlling proportional flows of the first and second heat transfer fluids into a fluid passage disposed in thermal communication with a processing component.

25. The method of claim 24, further comprising:

maintaining a continuous flow of each heat transfer fluid through a supply line and a return line of each manifold wherein the plurality of fluid passages are connected in parallel fluid communication between the supply line and the return line.

26. The method of claim 25, further comprising:

controlling a pressure differential between the supply line and the return line of each manifold.

* * * * *